United States Patent
Zhang et al.

(10) Patent No.: US 9,547,113 B2
(45) Date of Patent: Jan. 17, 2017

(54) POLARIZING FILTER AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Minghui Zhang, Beijing (CN); Dongxi Li, Beijing (CN); Xiaofeng Liu, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/517,296

(22) Filed: Oct. 17, 2014

(65) Prior Publication Data

US 2015/0338562 A1  Nov. 26, 2015

(30) Foreign Application Priority Data

May 23, 2014  (CN) .......................... 2014 1 0220533

(51) Int. Cl.
  *G02F 1/1333*  (2006.01)
  *G02F 1/1335*  (2006.01)
  (Continued)

(52) U.S. Cl.
  CPC ....... *G02B 5/3058* (2013.01); *G02F 1/133514* (2013.01); *G02F 1/133528* (2013.01);
  (Continued)

(58) Field of Classification Search
  CPC .................... G02F 1/133308; G02F 1/133514; G02F 1/133528; G02F 1/133536; G02F 1/13362; G02F 2001/136222; G02F 2001/133548; G02F 2203/072; H01L 27/3244; H01L 27/14625; G02B 1/08; G02B 5/30; G02B 5/3025; G02B 27/26; G02B 5/3058; G02B 2006/12116; G02B 6/126
  See application file for complete search history.

(56) References Cited

U.S. PATENT DOCUMENTS

2006/0251844 A1    11/2006  Choi et al.
2015/0323843 A1*   11/2015  Park ..................... G02F 1/13439
                                                                362/607

FOREIGN PATENT DOCUMENTS

CN           1452438 A      10/2003
CN           2849767 Y      12/2006
            (Continued)

OTHER PUBLICATIONS

English translation of CN 203338284.*
(Continued)

*Primary Examiner* — Pamela E Perkins
(74) *Attorney, Agent, or Firm* — Kinney & Lange, P.A.

(57) ABSTRACT

The present invention discloses a polarizing filter and a display device. The polarizing filter comprises a polarization layer and a conductive layer provided on one side of the polarization layer. In the present invention, the conductive layer is provided on the polarization layer, thus, when the electrostatic charge are present on the color film substrate having the polarizing filter, the electrostatic charge may be shielded by the conductive layer, and will not adversely affect the liquid crystal molecule between the color film substrate and a array substrate celled to the color film substrate even if the charge are present on a surface of the color film substrate, such that the display quality of the display panel having the color film substrate and the array substrate is improved. In addition, there is no need to provide a conductive tape used to guide the electrostatic charge out of the color film substrate in the display panel, so as to prevent some undesirable phenomenon, such as local uneven force on the panel, light leak and glue residue and the like, caused by the arrangement of the conductive tape.

8 Claims, 2 Drawing Sheets

(51) Int. Cl.
*G02B 5/30* (2006.01)
*H01L 27/15* (2006.01)
(52) U.S. Cl.
CPC .. *H01L 27/15* (2013.01); *G02F 2001/133334* (2013.01); *G02F 2001/133548* (2013.01); *G02F 2202/22* (2013.01)

(56) References Cited

FOREIGN PATENT DOCUMENTS

| | | | |
|---|---|---|---|
| CN | 102099716 | A | 6/2011 |
| CN | 202067055 | U | 12/2011 |
| CN | 202159156 | U | 3/2012 |
| CN | 202281885 | U | 6/2012 |
| CN | 103194724 | A | 7/2013 |
| CN | 203338284 | * | 12/2013 |
| JP | H07318707 | A | 12/1995 |
| JP | 2004101987 | A | 4/2004 |
| JP | 2004287347 | A | 10/2004 |
| JP | 2011-027879 | A | 2/2011 |

OTHER PUBLICATIONS

English translation of Chinese Office Action dated Oct. 10, 2015, for corresponding Chinese Patent Application No. 2014102205330.
Second Chinese Office Action dated Mar. 25, 2016, for corresponding Chinese Application No. 201410220533.0.

* cited by examiner

POLARIZING FILTER AND DISPLAY DEVICE

CROSS-REFERENCE TO RELATED APPLICATION

This application claims the benefit of Chinese Patent Application No. 201410220533.0 filed on May 23, 2014 in the State Intellectual Property Office of China, the whole disclosure of which is incorporated herein by reference.

BACKGROUND OF THE INVENTION

Field of the Invention

Embodiments of the present invention relate to a field of display technology, and more particularly, relates to a polarizing filter and a display device.

Description of the Related Art

Presently, a liquid crystal display panel is more and more widely used in various products, such as a mobile phone, a television and the like. In a liquid crystal display panel using ADS (Advanced Super Dimension Switch) technology, a horizontal electric field mode is adopted, a pixel electrode and a common electrode, which drive a liquid crystal molecule to deflect, are both provided on an array substrate, while no electrode is provided on a color film substrate, the electrostatic charge thus tends to be cumulated on the color film substrate and adversely affects the display quality of the display panel to some extent.

In order to solve the above-described problem, generally, a conductive tape is additionally attached to the display panel to prevent the display panel from being affected by the electrostatic charge. More specifically, firstly, a dedicated space for the conductive tape is preset, for example, the conductive tape may be provided on a surface of the color film substrate, and the electrostatic charge on the color film substrate may be guided out by the conductive tape. However, in the case of breakage of the conductive tape, the electrostatic charge on the color film substrate cannot be guided out by the conductive tape, thereby having adversely impact on the display effect of the display panel.

SUMMARY OF THE INVENTION

Embodiments of the present invention provide a polarizing filter and a display device so as to eliminate the influence on the display panel when the electrostatic charge on the color film substrate cannot be guided out.

In one aspect of the present invention, there is provided a polarizing filter, comprising:

a polarization layer; and a conductive layer provided on one side of the polarization layer.

In another aspect of the present invention, there is provided a display device, comprising:

a color film substrate, the upper side of the color film substrate being provided with a first polarizing filter comprising a first polarization layer and a first conductive layer provided on the first polarization layer;

an array substrate assembled to the color film substrate, the lower side of the array substrate being provided with a second polarizing filter comprising a second polarization layer and a second conductive layer provided on the second polarization layer.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF PREFERRED EMBODIMENTS OF THE INVENTION

Figure 1:
FIG. 1 is a partial sectional view of a polarizing filter according to a first exemplary embodiment of the present invention.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In addition, in the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Referring to FIG. 1, FIG. 1 is a partial sectional view of a polarizing filter according to a first exemplary embodiment of the present invention. The polarizing filter comprises a polarization layer 11, and a conductive layer 12 provided on one side of the polarization layer 11.

The polarizing filter provided by the embodiments of the present invention comprises the conductive layer, and this polarizing filter may be used in the liquid crystal display panel adopting ADS (Advanced Super Dimension Switch) technology. The display panel comprises an array substrate and a color film substrate assembled to the array substrate, and the polarizing filter is provided on one side of the color film substrate. When the electrostatic charge are present on the color film substrate, the electrostatic charge may be shielded by the conductive layer, and will not have an impact on the liquid crystal molecule between the color film substrate and the array substrate even if the charge are present on a surface of the color film substrate, such that the display quality of the display panel is improved. In addition, there is no need to provide a conductive tape used to guide the electrostatic charge out of the color film substrate in the display panel, so as to prevent some undesirable phenomenon, such as local uneven force on the panel, light leak and glue residue and the like, caused by the arrangement of the conductive tape.

Figure 2:
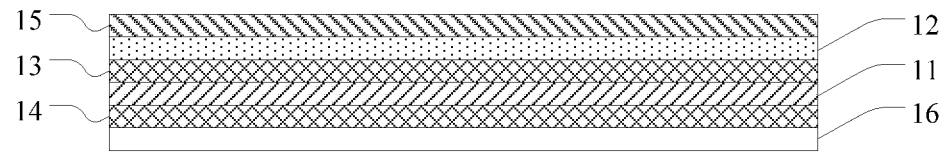
FIG. 2 is a partial sectional view of the polarizing filter according to a second exemplary embodiment of the present invention.

Referring to FIG. 2 which is a partial sectional view of the polarizing filter according to a second exemplary embodiment of the present invention, the polarizing filter comprises a polarization layer 11, a first support layer 13 provided on the upper side of the polarization layer 11, a second support layer 14 provided on the lower side of the polarization layer 11, a conductive layer 12 provided on the upper side of the first support layer 13, a protection layer 15 provided on the upper side of the conductive layer 12 and a adhesion layer 16 provided on the lower side of the second support layer 14. In an exemplary embodiment, the polarization layer 11 may be formed of PVA (Polyvinyl Alcohol) film, and the first support layer 13 as well as the second support layer 14 may be formed of TAC (Tri-Acetyl Cellulose) film, furthermore, the adhesion layer 16 may be made of pressure-sensitive adhesive.

In an embodiment, in order to prevent the aperture ratio of the display panel from being affected by the conductive layer, the conductive layer may be made of transparent conductive material. More particularly, during the manufacture of the polarizing filter, after forming the first support layer 13 above the polarization layer 11, a transparent conductive film layer is formed on the first support layer 13 so as to form the above-mentioned conductive layer 12.

Figure 3:
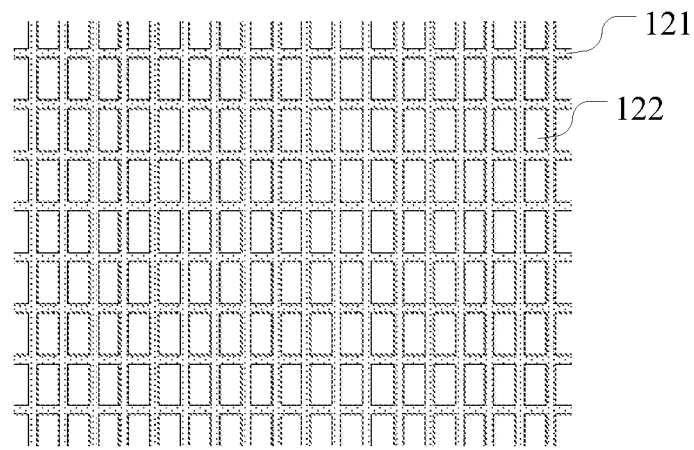
FIG. 3 is a schematic view of a conductive layer according to an exemplary embodiment of the present invention.

In an exemplary embodiment, the conductive layer 12 also may be provided as mesh structure, as shown in FIG. 3. The conductive layer also may be made of metal material, such as anyone of nickel, copper and aluminum. More particularly, a metal thin film layer is made on the first support layer, and then a metal mesh used as the conductive layer is obtained by performing process of applying photoresist, exposing, developing and etching.

Figure 4:
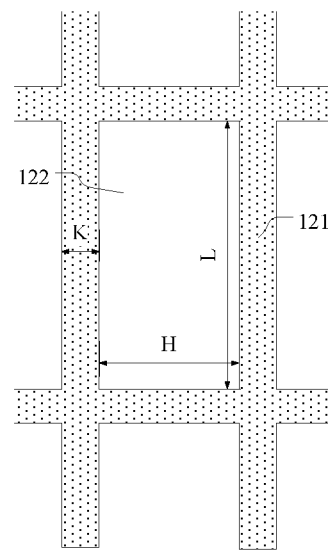
FIG. 4 is an enlarged schematic view showing a mesh hole of the conductive layer shown in FIG. 3.

Referring to FIG. 3, the above-mentioned conductive layer comprises a plurality of conductive threads 121 intersecting in a longitudinal direction and a transverse direction. Referring to FIG. 4, the conductive thread 121 has a width K of 0.006 mm~0.01 mm, such as 0.007 mm, 0.008 mm and the like.

The mesh hole 122 defined by the conductive threads 121 in the conductive layer 12 may has a rectangle shape, and has a width H of 0.02 mm~0.04 mm and a length L of 0.05 mm~0.07 mm. For example, the mesh hole has a width of 0.03 mm and a length of 0.06 mm. In an exemplary embodiment, in order to alleviate the interference phenomenon caused by the mesh structure, the width and length directions of the mesh hole are not parallel to the polarization direction of the polarizing filter, for example, the width or length direction of the mesh hole has an angle of 45 degree with respect to the polarization direction of the polarizing filter.

Figure 5:
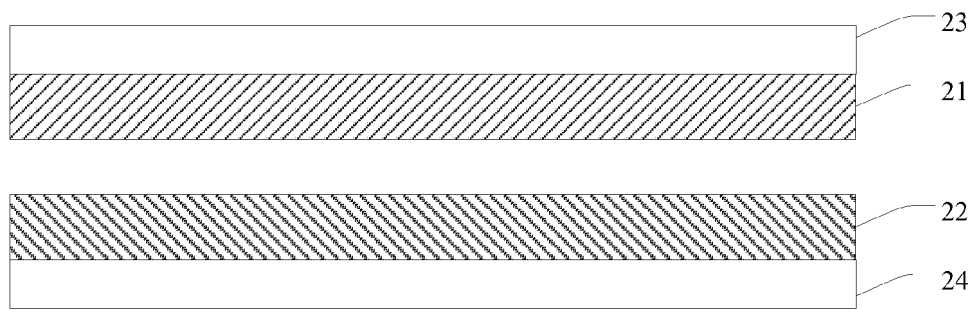
FIG. 5 is a partial sectional view of a display device according to the first exemplary embodiment of the present invention.

Referring to FIG. 5 which is a partial sectional view of a display device according to the first exemplary embodiment of the present invention, the display device comprises an array substrate 22 and a color film substrate 21 assembled or celled to the array substrate 21. The upper side of the color film substrate 21 is provided with a first polarizing filter 23, and the lower side of the array substrate 22 is provided with a second polarizing filter 24, wherein, the first polarizing filter 23 comprises a first polarization layer and a first conductive layer provided on the first polarization layer, and the second polarizing filter 24 comprises a second polarization layer and a second conductive layer provided on the second polarization layer, and the first and second conductive layers may be the conductive layers according to the above various embodiments.

Figure 6:
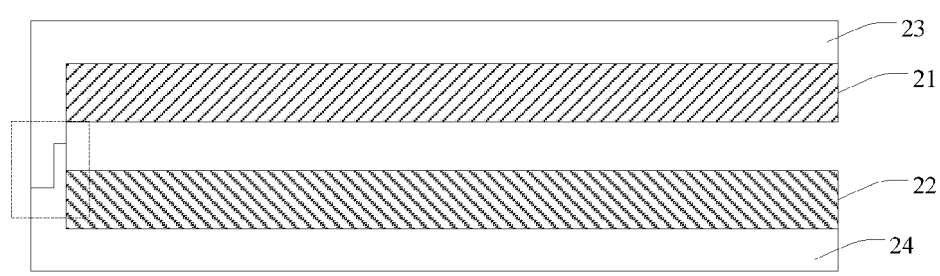
FIG. 6 is a partial sectional view of the display device according to the second exemplary embodiment of the present invention.
Figure 7:
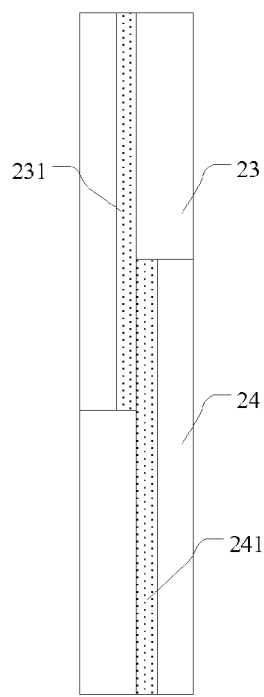
FIG. 7 is an enlarged schematic view of the dashed frame of FIG. 6, showing the connection of the first conductive layer and the second conductive layer.

In an exemplary embodiment, in order to further improve the capability of electrostatic shielding of the polarizing filter, referring to FIG. 6, the first conductive layer may be electrically connected with the second conductive layer, so that the celled structure formed by the array substrate and the color film substrate can be covered by the conductive layers. More specifically, referring to FIG. 7 which is an enlarged schematic view of the dashed frame of FIG. 6, the first conductive layer 231 is partially exposed at a short edge (or a lateral edge) of the first polarizing filter 23, and the second conductive layer 241 is partially exposed at a short edge (or the lateral edge) of the second polarizing filter 24. The short edge of the first polarizing filter 23 and the short edge of the second polarizing filter 24 are edge-to-edge jointed so as to electrically connect the first conductive layer 231 with the second conductive layer 241, and to further improve the capability of electrostatic shielding of the array substrate and the color film substrate.

In order to prevent the aperture ratio of the display panel from being adversely affected by the conductive layer, the first and second conductive layers may both be made of transparent conductive material. In addition, the first and second conductive layers may also be made of metal material, such as nickel, copper and aluminum or the like. When the above non-transparent metal material is used, in order to prevent the aperture ratio of the display panel from being affected by the conductive layer, each of the first and second conductive layers is provided to be a mesh structure comprising a plurality of conductive threads, wherein the conductive threads of the first conductive layer overlap a black matrix on the color film substrate, i.e. the projections in the thickness direction of the conductive threads and the black matrix onto the color film substrate are coincided with each other, so that the mesh hole on the conductive layer has the same shape as that of the pixel unit of the display panel, which prevents the aperture ratio of the display panel from being affected by the conductive layer.

The display device provided by the embodiments of the present invention may be any product or component having display function, such as a display screen of a notebook PC, an electronic paper, an organic light emitting diode display (OLED), liquid crystal display (LCD), liquid crystal display television (LCD TV), digital picture frame, mobile phone, tablet PC and the like.

According to the display device of the embodiments of the present invention, the color film substrate and the array substrate may be covered by the conductive layers by providing the conductive layer on the respective polarization layer. The electrostatic charge may be shielded by the conductive layers and will not adversely affect the liquid crystal molecule between the color film substrate and the array substrate even if the charge are present on a surface of the color film substrate, such that the display quality of the display panel is improved. In addition, there is no need to provide a conductive tape used to guide the electrostatic charge out of the color film substrate in the display panel, so as to prevent some undesirable phenomenon, such as local uneven force on the panel, light leak and glue residue and the like, caused by the arrangement of the conductive tape.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. A display device, comprising:
   a color film substrate, an upper side of the color film substrate being provided with a first polarizing filter comprising a first polarization layer and a first conductive layer provided on the first polarization layer; and
   an array substrate celled to the color film substrate, a lower side of the array substrate being provided with a second polarizing filter comprising a second polarization layer and a second conductive layer provided on the second polarization layer;
   a first support layer provided on an upper side of the first polarization layer, the first conductive layer being provided on an upper side of the first support layer; and
   a second support layer provided on a lower side of the first polarization layer;
   wherein the first conductive layer is in direct electrical contact with the second conductive layer, so that a celled structure formed by the array substrate and the color film substrate is covered by the first and second conductive layers to form electrostatic shielding of the first and second polarizing filters.

2. The display device according to claim 1, wherein, the first and second conductive layers each has a mesh structure comprising a plurality of conductive threads, the conductive threads overlapping a black matrix on the color film substrate.

3. The display device according to claim 1, wherein, the first and second conductive layers each is made of transparent conductive material.

4. The display device according to claim 1, wherein, the first and second conductive layers each has a mesh structure.

5. The display device according to claim 4, wherein the first and second conductive layers each is made of any one of nickel, copper and aluminum.

6. The display device according to claim 4, wherein, the first and second conductive layers each comprises a plurality of conductive threads intersecting in a longitudinal direction and a transverse direction, the conductive thread having a width of 0.006 mm~0.01 mm.

7. The display device according to claim 4, wherein, a mesh hole of the mesh structure has a rectangle shape, and has a width of 0.02 mm~0.04 mm and a length of 0.05 mm~0.07 mm.

8. The display device according to claim 7, wherein width and length directions of the mesh hole are not parallel to a polarization direction of the polarizing filter.

* * * * *